United States Patent [19]

Drake

[11] 4,309,810
[45] Jan. 12, 1982

[54] POROUS METAL FILMS
[75] Inventor: Miles P. Drake, Harlow, England
[73] Assignee: International Standard Electric Corporation, New York, N.Y.
[21] Appl. No.: 171,218
[22] Filed: Jul. 22, 1980
[30] Foreign Application Priority Data
   Aug. 9, 1979 [GB] United Kingdom ............... 27785/79
[51] Int. Cl.³ .......................... H01G 9/00; B05D 5/12; C23C 11/00
[52] U.S. Cl. .......................... 29/570; 427/80; 427/81; 427/124; 427/245; 427/250; 427/255.2; 427/255.3; 204/56 R; 204/58
[58] Field of Search ................ 427/81, 124, 245, 250, 427/80, 255.2, 255.3; 204/56 R, 58; 29/570

[56] References Cited
U.S. PATENT DOCUMENTS

| | | | |
|---|---|---|---|
| 2,914,643 | 11/1959 | Fields et al. | 427/250 |
| 3,303,550 | 2/1967 | Banzhof | 427/81 |
| 3,326,718 | 1/1967 | Dill | 427/81 |
| 3,357,867 | 5/1965 | Villani | 427/250 |
| 3,969,545 | 7/1976 | Slocum | 427/250 |
| 4,091,138 | 5/1978 | Takagi et al. | 427/81 |

OTHER PUBLICATIONS

Powell et al., Vapor Deposition, pp. 194-195, 223, 224, Wiley & Son, Inc. NY 1966.

Primary Examiner—Norman Morgenstern
Assistant Examiner—Richard Bueker
Attorney, Agent, or Firm—John T. O'Halloran; Thomas N. Twomey

[57] ABSTRACT

A process for preparing porous high surface over metal films for electrolytic capacitor manufacture. An anodizable metal is evaporated in a vacuum chamber to form a metal vapor, the metal vapor being directed towards a foil substrate. The deposition angle is chosen such that the evaporated metal condenses as a porous surface layer.

The coated foil may be used in the manufacture of electrolytic capacitors by anodizing the coating, applying contacts, and winding up the foil.

9 Claims, 2 Drawing Figures

POROUS METAL FILMS

BACKGROUND OF THE INVENTION

This invention relates to the preparation and treatment of metal films and coatings, and in particular to a process for the deposition of a metal in a porous form. The invention also relates to the manufacture of electrolytic capacitors from such treated metal films or coatings.

Porous metal films are employed in a variety of industrial applications. For example, wrapped foil electrolytic capacitors are fabricated conventionally from aluminum foil anodes and cathodes that have been chemically or electrochemically etched to produce a high surface area. Typically a strip of aluminum foil is etched to provide a microporous surface which is then anodized to produce a uniform dielectric layer.

There are a number of problems involved in the etching process, which nevertheless is the standard commercial process for the production of sufficiently high capacitance foils. Etching requires the use of large scale aqueous solution treatment and coating baths and presents maintenance and effluent disposal problems. Also etching solutions typically contain ions such as a chloride ($Cl^-$) which inhibit anodization and must therefore be thoroughly removed before anodization can take place. Furthermore the nature of the etched pits in the metal foil is such that high capacitance foils have narrow tunnels which results in a rapid fall in capacitance and a consequent deterioration in high frequency performance at higher anodizing voltages. This effect is caused by complete filling of the etched pore by the anodic oxide formed in the anodizing process.

SUMMARY OF THE INVENTION

The object of the invention is to provide a method for the deposition of a metal in a porous form on a substrate so that a uniform dielectric layer may be produced when the surface is anodized.

According to one aspect of the invention there is provided a process for preparing a porous metal film or coating on a substrate surface, including directing a stream of the metal vapour onto the surface in a vacuum, the deposition being performed at such an angle to the surface as to provide a porous metal deposit.

According to another aspect of the invention there is provided a method of making an electrolytic capacitor, including depositing on a metal or plastic substrate foil a vacuum evaporated porous coating of an anodizable metal, anodizing the surface of said porous layer, providing electrical contact to the porous layer, and winding the foil carrying the porous layer into a capacitor.

By evaporating a metal onto a substrate surface from certain directions a porous dentritic coating is obtained. This coating has the appearance of an array of bristles and provides a large surface area for subsequent anodization.

The above-mentioned and other features and objectives of this invention will become more apparent by reference to the following description taken in conjunction with the accompanying drawings.

DESCRIPTION OF THE PREFERRED EMBODIMENTS

Figure 1:
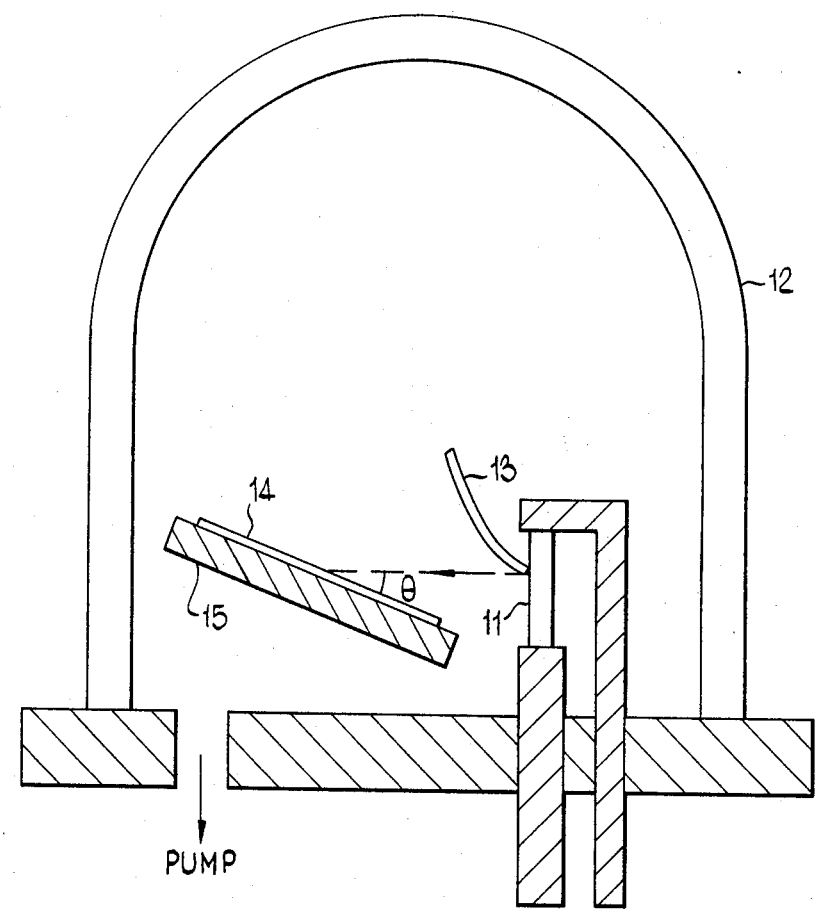
FIG. 1 is a schematic diagram of a metal evaporation process.

Referring to FIG. 1, a valve metal or a valve metal alloy is vacuum deposited onto a plane conductive or insulating substrate surface, the deposition being performed at such an angle to the surface that the metal is deposited as an array of spaced columnar crystals or dentrites. A resistor body 11 of boron nitride/tantalum diboride is maintained at a temperature of about 1600° C. in a vacuum chamber 12 by the passage of an electric current, typically 100-150 amps, and is supplied at a constant rate with aluminum wire 13 from a reel (not shown). The aluminum fuses on the resistor body 11 and evaporates therefrom, the evaporation taking place substantially in a direction normal to the resistor surface. In other applications this thermal evaporation technique may be replaced with an electron beam evaporation process.

The aluminum vapor stream thus produced impinges on a substrate 14, typically an aluminum foil, carried on a support 15. Preferably the support 15 is water cooled. The deposition of aluminum on the substrate 14 is performed at such an angle of incidence that the metal is deposited as a columnar array of metal crystals thus providing the substrate with a high surface area. It is essential that deposition is performed at an acute angle of incidence, and it is perferred that this angle is less than 60°. In a particularly advantageous embodiment the deposition angle lies between 5° and 10°. When observed under a microscope the deposited aluminum has the appearance of an array of bristles or whiskers.

In some applications an even higher surface area may be obtained by admitting a trace of oxygen into the vacuum chamber in which deposition is performed. We have found that a partial oxygen pressure up to and including $10^{-4}$ torr has the effect of reducing the deposited crystal dimensions and causing a certain amount of crystal branching.

The process described herein is not of course limited to the deposition of aluminum. Thus, other valve metals, and in particular tantalum, may be deposited in a porous form for subsequent anodization. For many such metals it is of course preferred to employ some form of electron beam evaporation or sputtering technique in place of thermal evaporation. Also alloys of two or more metals may be deposited.

The substrate may be made of the same metal as that which is being deposited or of a different metal. Moreover, in some applications, deposition may be affected on an insulating substrate such as a plastics foil or a ceramic body.

Figure 2:
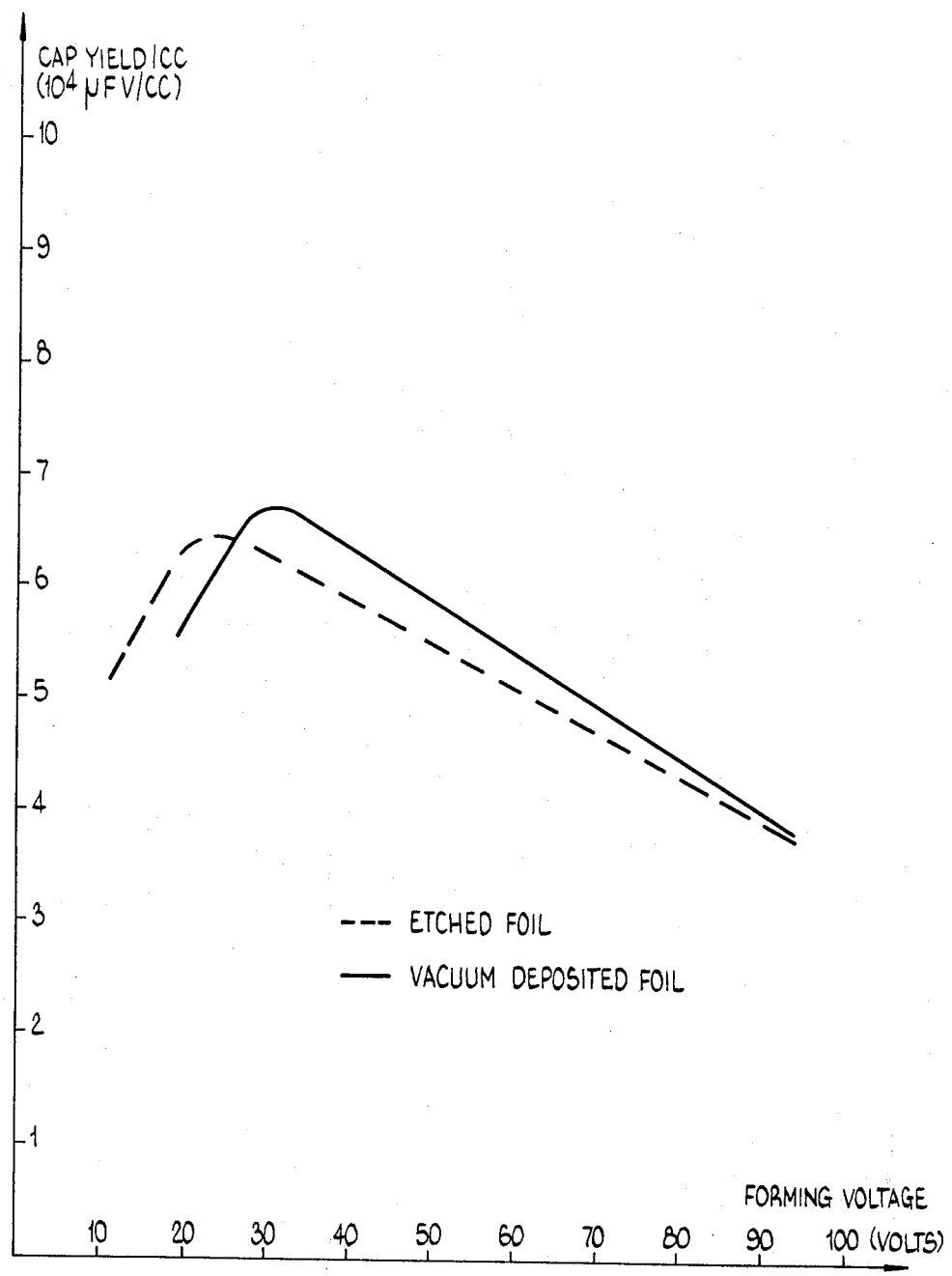
FIG. 2 illustrates the typical relationship between anodizing voltage and specific capacitance for anodized metal coatings prepared via the apparatus of FIG. 1.

The deposited porous metal layers described herein have particular application, although they are not so limited, to the manufacture of electrolytic capacitors, their high surface area being of particular advantage for this purpose. For such use the metal layer is first anodized in a conventional anodizing electrolyte and to a voltage exceeding, usually by 30%, that of the intended working voltage of the finished capacitor. The capacitance yield of an anodized metal layer will of course depend on the forming voltage applied, the relationship being illustrated in FIG. 2 which shows typical capacitance yields for a vacuum deposited aluminum film compared with a conventional etched aluminum film.

The following example illustrates the invention:

EXAMPLE

Using the apparatus shown in FIG. 1, aluminum was evaporated onto a 10 micron thick aluminum foil at a deposition angle of 10°. After 10 minutes of evaporation the vacuum system was vented and the foil removed. It was found that a film 6 microns thick and having a highly porous columnar structure had been grown. This film was anodized in a 4% by weight boric acid solution to a forming voltage of 200 V. The measured capacitance of this anodized foil was found to be 0.96 $\mu$F/cm$^2$ which corresponds to a capacitance yield of $6.4 \times 10^2$ $\mu$FV/cc.

It is thought that the porous columnar deposits produced by the methods described herein are dentritic in nature. However, it is not essential that dentrites are formed, it is merely necessary to produce a porous material.

Further modification to the metal surface may be achieved by the inclusion in the vacuum chamber of small quantities of inert gases, e.g. argon, which scatter the metal vapor and cause some vapor phase nucleation of fine metal particles.

The extension to a continuous process is possible using techniques of large scale vacuum evaporation in which electron beam sources impinge the vapor onto a large roll of aluminum sheet processed from reel-to-reel within a vacuum system.

Alternatively the technique of directly depositing a film onto a thermally stabilized roller of suitable material can be used in which the valve metal is caused to build first a thin cohesive film then a thick porous film onto the roller. The composite film is then stripped and rolled up.

In a further example, a piece of foil 10 cm$\times$1 cm, prepared as above, with an aluminum tag cold welded to one end, was formed in 1% potassium biphthalate solution to 33V. This foil was wrapped with a similar piece of foil with interleaved paper such that the vacuum deposited sides were facing. After reforming at 85° C. in a propriety working electrolyte and cooling to room temperature the assembled device had the following characteristics:

Cap Cap=80 $\mu$F
tan $\delta$=10%
leakage=<1.0$\mu$A at 25 V

Since the thickness of the foil was 50 $\mu$m total this represented a reduction in anode and cathode volume of some 50%.

A thicker foil prepared in the same way gave a similar device with the characteristics:

Cap=195 $\mu$F
tan $\delta$=10%
I$_2$=2.0 $\mu$A at 25V.

While I have described above the principles of my invention in connection with specific apparatus, it is to be clearly understood that this description is made only by way of example and not as a limitation to the scope of our invention as set forth in the objects thereof and in the accompanying claims.

I claim:

1. A method of making an electrolytic capacitor comprising the steps of:
   providing a substrate having a surface,
   feeding an anodizable metal from a reel of wire to a heat source,
   evaporating said metal to form a metal vapor,
   depositing said metal vapor on said substrate surface at an angle of incidence less than 60° and in the presence of oxygen at a partial pressure not exceeding 10$^{-4}$ Torr so as to provide a porous metal coating,
   anodizing the surface of the porous coating,
   providing electrical contact to said anodized surface, and
   winding said substrate having said anodized porous coating into a capacitor.

2. The method according to claim 1 wherein depositing said metal vapor on said substrate surface includes the step of adjusting the relative position of said substrate surface in relation to the source of said metal vapor so as to provide said angle of incidence which will give said porous metal coating.

3. The method according to claim 1 in which said substrate is selected to be a metal foil.

4. The method according to claim 1 in which said substrate is selected to be a plastic foil.

5. The method according to claim 3 in which said metal foil is selected to be aluminum.

6. The method according to claim 1 in which said anodizable metal is selected to be tantalum.

7. The method according to claim 1 wherein said anodizable metal is selected to be an alloy of two or more metals.

8. The method according to claim 1 in which said angle of incidence is between 5° and 10°.

9. The method as claimed in claim 1 further comprising providing a small quantity of an inert gas at the deposition site.

* * * * *